(12) United States Patent
Remington

(10) Patent No.: US 8,414,970 B2
(45) Date of Patent: Apr. 9, 2013

(54) ORGANOSILOXANE INCLUSIVE PRECURSORS HAVING RING AND/OR CAGE-LIKE STRUCTURES FOR USE IN COMBUSTION DEPOSITION

(75) Inventor: Michael P. Remington, Toledo, OH (US)

(73) Assignee: Guardian Industries Corp., Auburn Hills, MI (US)

( * ) Notice: Subject to any disclaimer, the term of this patent is extended or adjusted under 35 U.S.C. 154(b) by 1104 days.

(21) Appl. No.: 12/071,162

(22) Filed: Feb. 15, 2008

(65) Prior Publication Data

US 2009/0208644 A1 Aug. 20, 2009

(51) Int. Cl.
*B05D 5/06* (2006.01)
(52) U.S. Cl.
USPC ........... 427/166; 427/162; 427/164; 427/165; 427/167; 427/255.18; 427/452
(58) Field of Classification Search ............... 427/162, 427/164–167, 255.18, 452
See application file for complete search history.

(56) References Cited

U.S. PATENT DOCUMENTS

| | | | | |
|---|---|---|---|---|
| 5,043,002 | A * | 8/1991 | Dobbins et al. | 65/386 |
| 5,652,021 | A * | 7/1997 | Hunt et al. | 427/248.1 |
| 2002/0192980 | A1 * | 12/2002 | Hogle et al. | 438/778 |
| 2004/0039219 | A1 * | 2/2004 | Chen et al. | 556/464 |
| 2005/0181130 | A1 * | 8/2005 | Thomsen et al. | 427/249.7 |
| 2006/0003108 | A1 * | 1/2006 | Zobel et al. | 427/446 |
| 2006/0115654 | A1 * | 6/2006 | Thomsen | 428/432 |
| 2007/0113881 | A1 | 5/2007 | Mellott et al. | |
| 2007/0166456 | A1 * | 7/2007 | Kuehnle et al. | 427/240 |

FOREIGN PATENT DOCUMENTS

| | | |
|---|---|---|
| WO | WO 90/10596 | 9/1990 |
| WO | WO 99/20574 | 4/1999 |

OTHER PUBLICATIONS

U.S. Appl. No. 12/000,784, filed Dec. 17, 2007.
"Single-Molecule Precursor Chemistry for the Deposition of Chalcogenide (S or SE) containing Compound Semiconductors by MOCVD and Related Methods" O'Brien et al., J. Mater. Chem. 1995, pp. 1761-1773.
"Mechanisms of $SiO_2$ film deposition from tetramethylcyclotetrasiloxane, dimethyldimethoxysilane, and trimethylsilane plasmas" Zhang et al., J. Vac. Sci. Technol. A 22(1) Jan./Feb. 2004.
High-Temperature Chemistry of the Conversion of Siloxanes to Silicon Carbide, Burns et al., Chem. Mater. 1992.

(Continued)

*Primary Examiner* — Elizabeth Burkhart
(74) *Attorney, Agent, or Firm* — Nixon & Vanderhye P.C.

(57) ABSTRACT

Certain example embodiments relate to a method of forming a coating on a glass substrate using combustion deposition. A glass substrate having at least one surface to be coated is provided. An organosiloxane inclusive precursor having a ring- or cage-like structure to be combusted is introduced. Using at least one flame, at least a portion of the precursor is combusted to form a combusted material, the combusted material including non-vaporized material. The glass substrate is provided in an area so that the glass substrate is heated sufficiently to allow the combusted material to form the coating, directly or indirectly, on the glass substrate. In certain example embodiments, the precursor is a cyclic siloxane based and/or polyhedral silsesquioxane (POSS) based precursor, which advantageously may affect the coating's transmission and/or reflection properties compared to conventionally used silicon precursors. For example, a single-layer antireflective coating including silicon oxide may increase visible transmission of the uncoated substrate by at least about 2.0 %.

23 Claims, 3 Drawing Sheets

OTHER PUBLICATIONS

"Preparation of Silicon Carbide from Organosilicon Gels: 1, Synthesis and Characterization of Precursor Gels", White et al., Advanced Ceramic Materials, vol. 2, No. 1, 1987.

"Preparation of Silicon Carbide from Organosilicon Gels: 11, Gel Pyrolysis and SiC Characterization", White et al., Advanced Ceramic Materials, vol. 2, No. 1 1987.

"Nitrogen-Containing $SiO_2$ Glass Fibers Prepared by Ammonolysis of Gels Made from Silicon Alkoxides", Kamiya et al., Journal of Non-Crystalline Solids 83, 1986.

"Organic and Inorganic Spin-On Polymers for Low-Dielectric-Constant Applications" Hacker, MRS Bulletin/Oct. 1997.

"Nanoporous Silica as an Ultralow-k Dielectric", Jin et al., MRS Bulletin/Oct. 1997.

"Phase-Separated Inorganic-Organic Hybrids for Microelectronic Applications", Miller et al., MRS Bulletin/Oct. 1997.

"Chemical Vapor Deposition of Cubic Gallium Sulfide Thin Films: A New Metastable Phase", MacInnes et al., 1992 American Chemical Society.

"Chemical Vapor Deposition of Gallium Sulfide: Phase Control by Molecular Design", MacInnes et al., 1993 American Chemical Society.

"Organometallic Polymers as Precursors to Ceramic Materials: Silicon Nitride and Silicon Oxynitride", Laine et al, Supplied by The British Library—"The World's Knowledge".

* cited by examiner

US 8,414,970 B2

ORGANOSILOXANE INCLUSIVE PRECURSORS HAVING RING AND/OR CAGE-LIKE STRUCTURES FOR USE IN COMBUSTION DEPOSITION

FIELD OF THE INVENTION

Certain example embodiments of this invention relate to the deposition of metal oxide coatings onto substrates via combustion deposition. More particularly, certain example embodiments relate to combustion deposition techniques implementing an organosiloxane inclusive precursor having a ring- and/or cage-like structure (e.g., a cyclic siloxane based and/or polyhedral silsesquioxane (POSS) based precursor). In certain example embodiments, the metal oxide coating may be a silicon oxide coating (e.g., $SiO_2$, or other suitable stoichiometry) and, in certain example embodiments, the silicon oxide coating may serve as a single layer anti-reflective (SLAR or single layer AR) coating. The precursor may affect the phase, microstructure, and/or other properties of the deposited material in certain example embodiments. This may advantageously result in, for example, transmission-enhancing and/or reflection-reducing properties in certain example implementations. For example, in the case of depositing a SLAR coating comprising silicon oxide, the coating may increase visible transmission of the glass substrate by at least about 2.0%.

BACKGROUND AND SUMMARY OF EXAMPLE EMBODIMENTS OF THE INVENTION

Combustion chemical vapor deposition (combustion CVD) is a relatively new technique for the growth of coatings. Combustion CVD is described, for example, in U.S. Pat. Nos. 5,652,021; 5,858,465; and 6,013,318, each of which is hereby incorporated herein by reference in its entirety.

Conventionally, in combustion CVD, precursors are dissolved in a flammable solvent and the solution is delivered to the burner where it is ignited to give a flame. Such precursors may be vapor or liquid and fed to a self-sustaining flame or used as the fuel source. A substrate is then passed under the flame to deposit a coating.

There are several advantages of combustion CVD over traditional pyrolytic deposition techniques (such as CVD, spray and sol-gel, etc.). One advantage is that the energy required for the deposition is provided by the flame. Another advantage is that combustion CVD techniques do not necessarily require volatile precursors. If a solution of the precursor can be atomized/nebulized sufficiently, the atomized solution will behave essentially as a gas and can be transferred to the flame without requiring an appreciable vapor pressure from the precursor of interest. An atomized solution generally contains particle sizes small enough that the droplets do not experience inertial separation from the gas and impact the conduit (e.g., via inertial impaction) but large enough so that the solution does not separate from the gas diffusionally (e.g., via diffusional impaction).

In the areas of chemical vapor deposition (CVD) and bulk materials synthesis from molecular precursors, it has been shown that the molecular structure and composition of the precursor may enable the kinetic isolation of meta-stable phases and generate unique forms of target solid-state material (for a review, see Paul O'Brien and Ryôki Nomura, "Single-molecule precursor chemistry for the deposition of chalcogenide (S or Se)-containing compound semiconductors by MOCVD and related methods," *J Mater. Chem.*, vol. 5, no. 11, pp. 1761-1773 (1995)). One of the more interesting examples in the literature is given by Barron and co-workers in the deposition of cubic GaS from the novel cubane molecular precursor $[(tBu)GaS]_4$ (Andrew N. MacInnes et al., "Chemical vapor deposition of cubic gallium sulfide thin films: a new metastable phase," *Chem. Mater.*, vol. 4, no. 1, pp. 11-14 (1992); Andrew N. MacInnes et al., "Chemical vapor deposition of gallium sulfide: phase control by molecular design," *Chem. Mater.*, vol. 5, no. 9, pp. 1344-1351 (1993)).

Thus, it will be appreciated that there is evidence that the precursor can influence the phase, microstructure, and/or other properties of the deposited material. To this end, it will be appreciated that combustion deposition techniques may be used to deposit metal oxide coatings (e.g., singly-layer anti-reflective coatings) on glass substrates, for example, to alter the optical properties of the glass substrates (e.g., to increase visible transmission).

For example, in certain example embodiments, combustion deposition may be used to deposit coatings of silicon oxide (e.g., $SiO_2$ or other suitable stoichiometry) using silicon precursors. As will be described in greater detail below, it has been determined that the coatings produced using the techniques disclosed herein have improved transmission-enhancing and/or reflection-reducing properties as compared to conventional CVD or combustion deposited coatings grown from typical silicon precursors such as, for example, hexamethyldisiloxane (HMDSO), tetraethyl orthosilicate (TEOS), silicon tetrachloride ($SiCl_4$ or other suitable stoichiometry), trialkyl silanes ($R_3SiH$ or other suitable stoichiometry), and alkoxy silanes ($R_2Si(OR')_2$, where R is H or an organic group and R' is an organic group). U.S. Publication No. 2006/0003108, the entire contents of which are hereby incorporated herein by reference, discloses prior art techniques for using flame deposition to deposit SLAR coatings).

It also will be appreciated that there is a need in the art for combustion deposition techniques that represent an improvement over conventional combustion CVD techniques, and/or improved techniques for depositing metal oxide coatings (e.g., single layer anti-reflective coatings) on glass substrates via combustion deposition.

In certain example embodiments of this invention, a method of forming a coating on a glass substrate using combustion deposition is provided. A glass substrate having at least one surface to be coated is provided. An organosiloxane inclusive precursor at least initially having a ring- and/or cage-like structure to be combusted is introduced. Using at least one flame, at least a portion of the precursor is combusted to form a combusted material, with the combusted material comprising non-vaporized material. The glass substrate is provided in an area so that the glass substrate is heated sufficiently to allow the combusted material to form the coating, directly or indirectly, on the glass substrate.

In certain example embodiments, a method of forming a coating on a glass substrate using combustion deposition is provided. A glass substrate having at least one surface to be coated is provided. An organosiloxane inclusive precursor at least initially having a ring- and/or cage-like structure to be combusted is introduced. Using at least one flame, at least a portion of the precursor is combusted to form a combusted material, with the combusted material comprising non-vaporized material. The glass substrate is provided in an area so that the glass substrate is heated sufficiently to allow the combusted material to form the coating, directly or indirectly, on the glass substrate. The deposited coating comprises silicon oxide. The coating increases visible transmission of the glass substrate by at least about 2.0%.

Thus, the organosiloxane inclusive precursor having a ring- and/or cage-like structure may affect the phase, microstructure, and/or other properties of the deposited material in certain example embodiments. This may advantageously result in, for example, transmission-enhancing and/or reflection-reducing properties in certain example implementations.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Figure 1:
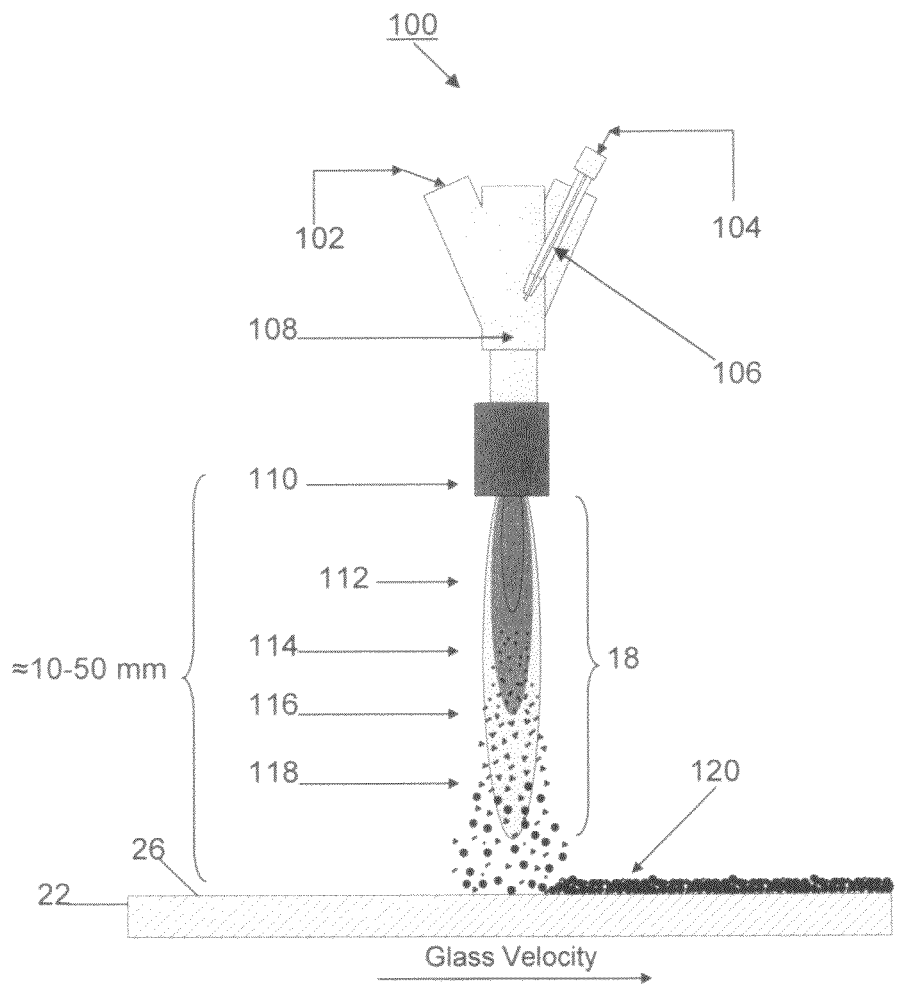
FIG. 1 is a simplified view of an apparatus used to carry out combustion deposition in accordance with an example embodiment.

In certain example embodiments of this invention, a method of forming a coating on a glass substrate using combustion deposition is provided. A glass substrate having at least one surface to be coated is provided. A precursor to be combusted is introduced. Using at least one flame, at least a portion of the precursor is combusted to form a combusted material, with the combusted material comprising non-vaporized material. The glass substrate is provided in an area so that the glass substrate is heated sufficiently to allow the combusted material to form the coating, directly or indirectly, on the glass substrate. In certain example embodiments, the precursor is an organosiloxane inclusive precursor at least initially having a ring- and/or cage-like structure (e.g., a cyclic siloxane based and/or polyhedral silsesquioxane (POSS) based precursor). The precursor may affect the phase, microstructure, and/or other properties of the deposited material in certain example embodiments. This may advantageously result in, for example, transmission-enhancing and/or reflection-reducing properties in certain example implementations. This is because the ring- or cage-like structure of the precursor may lead to a less dense or voided microstructure in the deposited coating, effectively reducing the refractive index of the coating. For example, in the case of depositing a SLAR coating comprising silicon oxide, the coating may increase visible transmission of the glass substrate by at least about 2.0%.

In certain example embodiments, a fuel gas and oxygen source are selected and mixed together to form a combustion gas mixture. At least a portion of the combustion gas mixture is used in forming the coating. A precursor is selected such that at least a portion of the combustion products form a coating with desired properties. The precursor is introduced into the combustion gas stream to form a reagent mixture. Using at least one burner, at least a portion of the reagent mixture is reacted via combustion to form reaction products, with at least a portion of the reaction products comprising non-vaporized material. In certain example embodiments, the precursor is an organosiloxane inclusive precursor at least initially having a ring- and/or cage-like structure (e.g., a cyclic siloxane based and/or polyhedral silsesquioxane (POSS) based precursor). The precursor may affect the phase, microstructure, and/or other properties of the deposited material in certain example embodiments. This may advantageously result in, for example, transmission-enhancing and/or reflection-reducing properties in certain example implementations. This is because the ring- or cage-like structure of the precursor may lead to a less dense or voided microstructure in the deposited coating, effectively reducing the refractive index of the coating. For example, in the case of depositing a SLAR coating comprising silicon oxide, the coating may increase visible transmission of the glass substrate by at least about 2.0%.

FIG. 1 is a simplified view of an apparatus 100 used to carry out combustion deposition in accordance with an example embodiment. A combustion gas 102 (e.g., a propane air combustion gas) is fed into the apparatus 100, as is a suitable precursor 104 (e.g., via insertion mechanism 106, examples of which are discussed in greater detail below). Precursor nebulization (108) and at least partial precursor evaporation (110) may occur in the apparatus 100 or outside the apparatus 100 in a separate piece of hardware. The precursor can also have been delivered as a vapor reducing or even eliminating the need for nebulization The flame 18 may be thought of as including multiple areas. Such areas correspond to chemical reaction area 112 (e.g., where reduction, oxidation, and/or the like may occur), nucleation area 114, coagulation area 116, and agglomeration area 118. Of course, it will be appreciated that such example areas are not discrete and that one or more of the above processes may begin, continue, and/or end throughout one or more of the other areas.

Particulate matter begins forming within the flame 18 and moves downward towards the surface 26 of the substrate 22 to be coated, resulting in film growth 120. As will be appreciated from FIG. 1, the combusted material comprises non-vaporized material (e.g., particulate matter), which is also at least partially in particulate form when coming into contact with the substrate 22. To deposit the coating, the substrate 22 may be moved (e.g., in the direction of the velocity vector). Of course, it will be appreciated that the present invention is not limited to any particular velocity vector, and that other example embodiments may involve the use of multiple apparatuses 100 for coating different portions of the substrate 22, may involve moving a single apparatus 100 while keeping the substrate in a fixed position, etc.

As noted above, the choice of precursor may affect the phase, microstructure, and/or other properties of the deposited material. This may advantageously result in, for example, transmission-enhancing and/or reflection-reducing properties in certain example implementations. Thus, certain example embodiments implement combustion deposition using precursors that result in improved silicon oxide SLAR coatings. Moreover, certain example embodiments provide a method for making silicon oxide (e.g., $SiO_2$ or other suitable stoichiometry) based coatings via combustion deposition using organosiloxanes that have the potential to deposit coating micro-structures that lead to enhanced transmission gains and/or reflection reductions.

More particularly, certain example embodiments implement one or both of two different classes of organosiloxanes, including cyclic siloxanes and polyhedral silsesquioxanes (POSS).

Example Cyclic Siloxane Based Precursors

The cyclic siloxanes generally may be represented by the formula $(R_1R_2SiO)_n$ where $R_1$ is a hydrogen atom, a halogen atom, or an organic group (e.g., a carbon-inclusive group such as, for example, $CH_3$), $R_2$ is an organic group (e.g., a carbon-inclusive group such as, for example, $CH_3$), and n is about 2-10. More preferably, n is about 3-5. When R1 and R2 are both an organic group, they may be the same organic group or different organic groups. The cyclic siloxanes may be delivered to the flame as a gas, as an atomized liquid, and/or as an atomized solution. Preferred cyclic siloxanes include decamethylcyclopentasiloxane (or D5), and 1,3,5,7-tetramethyltetrasiloxane (or D'4). For D5, $R_1$ and $R_2$ are $CH_3$ and n is equal to 5 (e.g., $[(CH_3)_2SiO]_5$). For D'4, $R_1$ is H, $R_2$ are $CH_3$ and n is 4 (e.g., $[(CH_3)HSiO]_4$). It will be appreciated that the any other suitable stoichiometry of any of the above also molecules or groups may be used in certain example embodiments.

When cyclic siloxanes are used as precursors, reactive intermediates sometimes may be advantageously produced that otherwise would not be accessible by using conventional precursors. This may lead to different reaction and/or deposition mechanisms, producing, for example, different coating microstructures and/or morphologies.

Cyclic siloxanes also have the potential to retain some of the ring structure in the final coating, which may advantageously lead to a microstructure conducive to generating coatings with low effective refractive indices and thereby enhance AR properties. Evidence for the retention of at least some of the starting structure of cyclic oligosiloxanes in the deposition of silicon oxide coatings can be inferred from the data collected in the plasma deposition of silicon oxide films from D'4 (see Jianming Zhang et al., "Mechanisms of $SiO_2$ film deposition from tetramethylcyclotetrasiloxane, dimethyldimethoxysilane, and trimethylsilane plasmas," *J. Vac. Sci. Technol. A*, vol. 22, no. 1, pp. 201-213 (2004)). Cyclic siloxanes are well known starting materials to silicon oxide coatings by various depositions, although it is believed that none have been used in connection with conventional combustion CVD applications or in connection with the combustion deposition techniques of certain example embodiments, e.g., involving enhanced SLAR coatings created via combustion deposition.

The following table demonstrates certain advantages of using the cyclic siloxane D5 over the linear siloxane HMDSO in the deposition of silicon oxide coatings using a linear type burner. The precursors were delivered to the flame as a vapor. For each precursor, the combustion conditions (air flow and air-to-propane ratio) were optimized to maximize the transmission gain. The D5 depositions were carried out on an uncoated glass substrate with a transmission of 90.6% while the uncoated glass substrate for the HMDSO depositions measured 91.0%. Optimum deposition distance (burner to substrate) for D5 is about 35 mm while that for HMDSO is about 20 mm. In these examples, the air flow rate used with D5 was 300 standard liters per minute (SLM) and the air-to-propane ratio was 16. For HMDSO, air flow rate used was 225 and the air-to-propane ratio was 20. In general, in certain example implementations, process conditions may include a flame temperature of between about 1000-1400° C., an air-to-propane ratio of about 15-30, an air flow rate of between about 100-300 standard liters per minute, and a burner-to-lite distance of about 10-50 mm.

| Precursor | Gas Phase Concentration (mol %) | Gas Phase Silicon Concentration (mol %) | Coating Thickness (nm) | Transmission (%, visible) | Transmission Gain (%, visible) | Haze |
|---|---|---|---|---|---|---|
| D5 | 0.006 | 0.03 | 144 | 92.6 | 2.0 | 0.8 |
| HMDSO | 0.015 | 0.03 | 131 | 92.2 | 1.2 | 0.5 |

As shown in the table, for the same gas phase concentration of silicon and nominally the same thickness, the D5 provides a much higher transmission gain than HMDSO (67% higher). Additionally, D5 is slightly higher in deposition efficiency. While the particular example above shows a roughly 10% increase in deposition efficiency over HMDSO, the observed range has been between 5% and 35%.

Example Polyhedral Silsesquioxanes (POSS) Based Precursors

Figure 2:
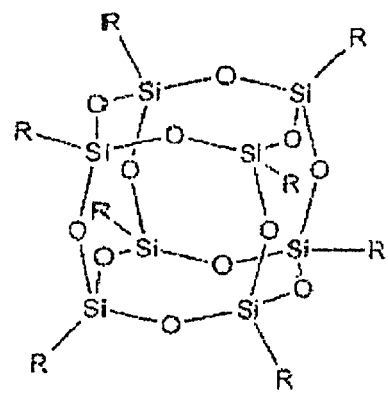
FIG. 2 is a general schematic of a substantially fully condensed POSS precursor.

POSS precursors generally have cage-like structures with an empirical formula of $(RSiO_{1.5})_n$ (or other suitable stoichiometry) with a silicon-to-oxygen ratio of about 2:3. FIG. 2 is a general schematic of a substantially fully condensed POSS precursor.

Figure 3:
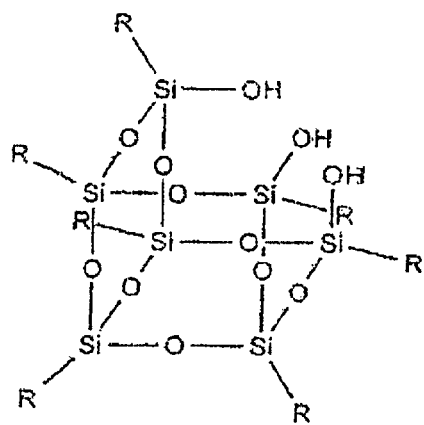
FIG. 3 is a general schematic of an incompletely condensed POSS precursor.

Incompletely condensed POSS precursors also may be used in connection with certain example embodiments. FIG. 3 is a general schematic of an incompletely condensed POSS precursor. Incompletely condensed POSS precursors typically have reactive silanol (Si—OH or other suitable stoichiometry) groups that can aid in bonding to the substrate (e.g., glass substrate) and/or allow cross-condensation with other POSS precursors in the reaction zone.

As most POSS compounds typically are not volatile, they may be delivered to the flame in the combustion deposition process as an atomized/nebulized solution. If the molecular structure of the POSS compound could survive the flame, then some of the cage structure would be retained, thereby leading to a coating microstructure conducive to high transmission and/or low reflection properties.

POSS compounds are commercially available. For example, they have been used as precursors to silicon carbide (SiC) powders (see G. T. Burns et al., "High-temperature chemistry of the conversion of siloxanes to silicon carbide," *Chem. Mater.*, vol. 4, no. 6, pp. 1313-1323 (1992); D. A. White, "Preparation of silicon carbide from organosilicon gels: I, Synthesis and Characterization of Precursor Gels," *Adv. Ceram. Mater.*, vol. 2, no. 1, pp. 45-52 (1987); D. A. White, "Preparation of silicon carbide from organosilicon gels: II. Gel pyrolysis and SiC characterization," *Adv. Ceram. Mater.*, vol. 2, no. 1, pp. 53-59 (1987)), nitrided glass (e.g., when reacted with $NH_3$, see K. Kamiya et al., "Nitrogen-containing $SiO_2$ glass fibers prepared by ammonolysis of gels made from silicon alkoxides," *J. Noncryst. Solids*, vol. 83, no. 2, pp. 208-222 (1986)), silicon oxynitride (R. M. Laine et al., "Ultrastructure Processing of Advanced Ceramics," D. J. Mackenzie and D. R. Ulrich, eds., Wiley-Interscience: New York: 1998, p. 761), low dielectric constant materials (N. P. Hacker, "Organic and inorganic spin-on polymers for low-dielectric-constant applications," *MRS Bull.*, vol. 22, no. 10, pp. 33-38 (1997); J. Changming et al., "Nanoporous Silica as an Ultralow-k Dielectric," *MRS Bull.*, vol. 22, no. 10, pp. 39-42; R. D. Miller et al., "Phase-Separated Inorganic-Organic Hybrids for Microelectronic Applications" *MRS Bull.*, vol. 22, no. 10, pp. 44-48), and a variety of microporous materials. It is believed that POSS precursors have not been used in the connection with the deposition of SLAR coatings or in the use of any CVD technique.

Example Results

The results of using organosiloxane precursors having ring- or cage-like structures in connection with combustion deposition techniques to produce metal oxide coatings have been very positive. For example, when D5 was used as a precursor, coatings have produced a $T_{vis}$ increase of about 2.0% per side of the substrate with a total $T_{vis}$ gain of about 4.0%. Using HMDSO, the best coating possessed a $T_{vis}$ gain of only about 1.4-1.6% per side for approximately the same coating thickness but requires a specific burner and combustion condition. See, for example, co-pending and commonly owned application Ser. No. 12/000,784, the entire contents of which are hereby incorporated herein by reference.

Additionally, the microstructure of the D5 deposited coatings is very different from the HMDSO coatings. The coating microstructure of the high $T_{vis}$ coatings made from D5 reveal substantially spherical nuclei and/or clusters on the surface that resemble Gravure coatings comprising silicon oxide nano-particles held together by a silicon oxide binder. As is known, the Gravure coating process typically involves using an engraved roller running in a coating bath, which fills the engraved dots or lines of the roller with the coating material, and excess coating on the roller is wiped off by a doctor blade and the coating is then deposited onto the substrate as it passes between the engraved roller and a pressure roller.

Figure 4:
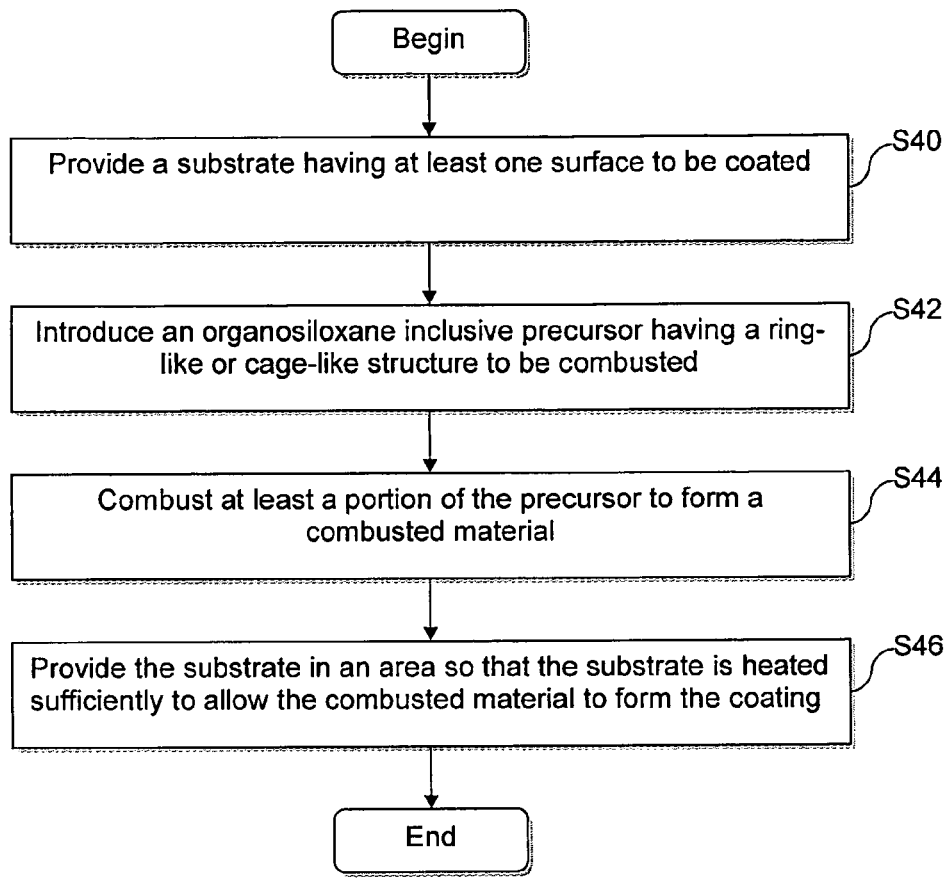
FIG. 4 is an illustrative flowchart illustrating a process for applying a single layer anti-reflective (SLAR) coating to a glass substrate using combustion deposition in accordance with an example embodiment.

FIG. 4 is an illustrative flowchart illustrating a process for applying a single layer anti-reflective (SLAR) coating to a glass substrate using combustion deposition in accordance with an example embodiment. In step S40, a substrate (e.g., a glass substrate) having at least one surface to be coated is provided. An organosiloxane inclusive precursor having a ring- or cage-like structure (e.g., a cyclic siloxane based precursor, a polyhedral silsesquioxane (POSS) based precursor, etc.) to be combusted is introduced in step S42. In step S44, at least a portion of the precursor is combusted, thereby forming a combusted material. The precursors may be introduced by a number of means. For example, the precursors may be introduced in a vapor state via a bubbler or other means of vaporization or sublimation, as large particle droplets via an injector, and/or as small particle droplets via a nebulizer. In certain example implementations, a cyclic siloxane based precursor may be delivered to a flame of the burner as a gas, atomized liquid, and/or atomized solution. In certain example implementations, a POSS based precursor may be delivered to a flame of the burner as an atomized solution. The combusted material comprises non-vaporized material (e.g., at least some particulate matter). In step S46, the substrate is provided in an area so that the substrate is heated sufficiently to allow the combusted material to form the coating on the substrate. The coating may be formed either directly or indirectly on the substrate. Optionally, in a step not shown, the opposing surface of the substrate also may be coated. Also optionally, the substrate may be wiped and/or washed, e.g., to remove excess non-adherent particulate matter deposited thereon.

It will be appreciated that the techniques of the example embodiments described herein may be applied to a variety of products. That is, a variety of products potentially may use these and/or other AR films, depending in part on the level of transmission gain that is obtained. Such potential products include, for example, photovoltaic, green house, sports and roadway lighting, fireplace and oven doors, picture frame glass, etc. Non-AR products also may be produced.

The example embodiments described herein may be used in connection with multiple layer AR coatings, as well. By way of example and without limitation, multiple reagents and/or precursors may be selected to provide coatings comprising multiple layers.

It will be appreciated that any organosiloxane inclusive precursor having a ring- and/or cage-like structure may be used in connection with certain example embodiments. As noted above, this includes, for example, cyclic siloxane based and polyhedral silsesquioxane (POSS) based precursors. However, it does not include precursors that do not have a ring- or cage-like structure such as precursors that have a generally linear structure when in monomer form including, for example, HMDSO, TEOS, silicon tetrachloride, etc.

Although a film or coating may be said to be "on" or "supported" by one or more of the substrates herein, this does not mean that the film or coating must directly contact the substrate(s). In other words, the word "on" covers both directly and indirectly on, so that the film or coating may be considered "on" a substrate even if other material (e.g., a coating and/or thin film) is provided between the substrate and the film or coating.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of forming a single layer anti-reflection coating on a glass substrate using combustion deposition, the method comprising:
   providing a glass substrate having at least one surface to be coated;
   introducing an organosiloxane inclusive precursor at least initially having a ring-like or cage-like structure to be combusted;
   combusting, using at least one flame, at least a portion of the precursor to form a combusted material, the combusted material comprising non-vaporized material, the at least a portion of the precursor being combusted such that at least some of the ring-like or cage-like structure of the precursor survives the combusting, and the combusted material at least partially comprises a ring-like or cage-like structure; and
   providing the glass substrate in an area so that the glass substrate is heated sufficiently to allow the combusted material to form the coating, directly or indirectly, on the glass substrate, wherein the anti-reflection coating at least partially comprises a less dense and/or voided microstructure due to the ring- or cage-like structure of the precursor.

2. The method of claim 1, wherein the coating comprises an oxide of silicon.

3. The method of claim 2, wherein the precursor is a cyclic siloxane based precursor.

4. The method of claim 3, further comprising delivering the cyclic siloxane based precursor to the flame as a gas, atomized liquid, and/or atomized solution.

5. The method of claim 3, wherein the cyclic siloxane based precursor is decamethylcyclopentasiloxane (D5).

6. The method of claim 3, wherein the cyclic siloxane based precursor is 1,3,5,7-tetramethyltetrasiloxane (D'4).

7. The method of claim 2, wherein the precursor is a polyhedral silsesquioxane (POSS) based precursor.

8. The method of claim 7, wherein the POSS based precursor has an empirical formula of $(RSiO_{1.5})_n$ and a silicon-to-oxygen ratio of about 2:3.

9. The method of claim 7, wherein the POSS based precursor is substantially fully condensed.

10. The method of claim 7, wherein the POSS based precursor is incompletely condensed.

11. The method of claim 10, wherein the incompletely condensed POSS based precursor includes one or more reactive silanol groups that facilitate(s) bonding between the coating and the substrate and/or allow(s) cross-condensation with other POSS precursors in a reaction zone of a flame.

12. The method of claim 7, further comprising delivering the POSS based precursor to a flame as an atomized solution.

13. The method of claim 1, further comprising depositing at least one additional coating via combustion deposition on a second surface of the glass substrate.

14. The method of claim 1, wherein the coating increases visible transmission of the glass substrate by at least about 2.0%.

15. A method of applying a coating to a substrate using combustion deposition, the method comprising:
providing a substrate having at least one surface to be coated;
introducing an organosiloxane inclusive precursor at least initially having a ring-like or cage-like structure to be combusted;
combusting, using at least one flame, at least a portion of the precursor to form a combusted material, the combusted material comprising non-vaporized material; and
providing the substrate in an area so that the substrate is heated sufficiently to allow the combusted material to form the coating, directly or indirectly, on the substrate,
wherein the combusted material at least partially comprises the ring- or cage-like structure of the precursor;
wherein the deposited coating comprises silicon oxide, and
wherein the coating at least partially comprises a less dense and/or voided microstructure due to the ring- or cage-like structure of the precursor and increases visible transmission of the glass substrate by at least about 2.0%.

16. The method of claim 15, wherein the precursor is a cyclic siloxane based precursor.

17. The method of claim 16, further comprising delivering the cyclic siloxane based precursor to a flame as a gas, atomized liquid, and/or atomized solution.

18. The method of claim 16, wherein the cyclic siloxane based precursor is decamethylcyclopentasiloxane (D5) or 1,3,5,7-tetramethyltetrasiloxane (D'4).

19. The method of claim 15, wherein the precursor is a polyhedral silsesquioxane (POSS) based precursor.

20. The method of claim 19, wherein the POSS based precursor has an empirical formula of $(RSiO_{1.5})_n$ and a silicon-to-oxygen ratio of about 2:3.

21. The method of claim 19, wherein the POSS based precursor is substantially fully condensed.

22. The method of claim 19, wherein the POSS based precursor is incompletely condensed.

23. The method of claim 19, further comprising delivering the POSS based precursor to a flame as an atomized solution.

* * * * *